United States Statutory Invention Registration [19]

[11] Reg. Number: H546

Schnable et al.

[43] Published: Nov. 1, 1988

[54] FORMATION OF THIN-FILM RESISTORS ON SILICON SUBSTRATES

[75] Inventors: George L. Schnable, Montgomery County, Pa.; Chung P. Wu, Hamilton Township, Mercer County, N.J.

[73] Assignee: The United States of America as represented by the Secretary of the Air Force, Washington, D.C.

[21] Appl. No.: 160,893

[22] Filed: Feb. 26, 1988

[51] Int. Cl.[4] ..... B22F 3/02

[52] U.S. Cl. ..... 419/7; 437/63

*Primary Examiner*—Herbert B. Guynn
*Assistant Examiner*—Eric Jorgensen
*Attorney, Agent, or Firm*—William Stepanishen; Donald J. Singer

[57] ABSTRACT

The formation of thin-film resistors by the ion implantation of a metallic conductive layer in the surface of a layer of phosphosilicate glass or borophosphosilicate glass which is deposited on a silicon substrate. The metallic conductive layer materials comprise one of the group consisting of tantalum, ruthenium, rhodium, platinum and chromium silicide. The resistor is formed and annealed prior to deposition of metal, e.g. aluminum, on the substrate.

6 Claims, 1 Drawing Sheet

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

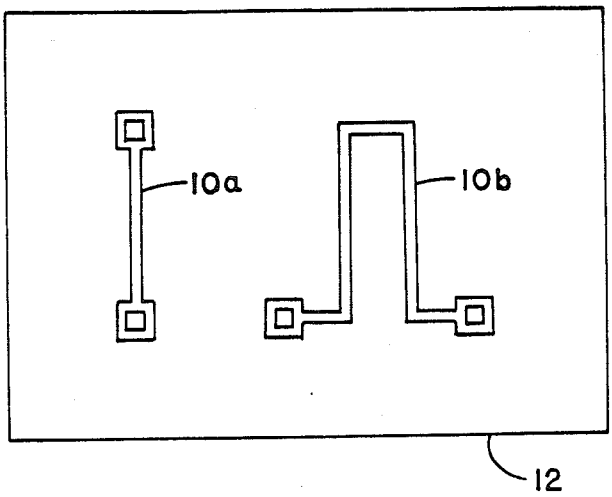
10a
10b
12

FORMATION OF THIN-FILM RESISTORS ON SILICON SUBSTRATES

STATEMENT OF GOVERNMENT INTEREST

The invention described herein may be manufactured and used by or for the Government for governmental purposes without the payment of any royalty thereon.

BACKGROUND OF THE INVENTION

The present invention relates broadly to thin-film resistors and in particular to the formation of thin-film resistors on silicon substrates by ion implantation.

Direct ion implantation is frequently used in the fabrication process of integrated circuits as a useful alternative to high-temperature diffusion. In this process a beam of impurity ions is accelerated to kinetic energies ranging from several keV to several MeV and is directed onto the surface of the semiconductor. As the impurity atoms enter the crystal, they give up their energy to the lattice in collisions and finally come to rest at some average penetration depth. Depending on the impurity and its implantation energy, the penetration depth in a given semiconductor may vary from a few hundred angstroms to about 1 μm. The distribution of implanted impurities in the semiconductor material is approximately a gaussian distribution. A uniformly doped region may be achieved by several implantations at different energies.

The obvious advantage of implantation is that it can be done at relatively low temperatures. The ions can be blocked by metal or photo-resist layers; therefore, the photo-lithographic techniques may be used to define ion implanted doping patterns. Very shallow (tenths of a micron) and well-defined doping layers can be achieved.

One of the major advantages of ion implantation is the precise control of doping concentration it provides. Since the ion beam current can be measured accurately during implantation, a precise quantity of impurity can be introduced. This control over doping level, along with the uniformity of the implant over the wafer surface, make ion implantation particularly attractive for the fabrication of Si integrated circuits.

One problem with this doping method is the lattice damage which results from collisions between the ions and the lattice atoms. However, most of this damage can be removed in Si by heating the crystal after the implantation. This process is called annealing. Although Si can be heated to temperatures in excess of 1000° C. without difficulty, some other compounds tend to dissociate at high temperatures. By using annealing methods it is possible to dope Si or compound semiconductors with good control over doping concentration and with the geometrical tolerances that are required for electronic device fabrication.

The state of the art of thin-film resistors is well represented and alleviated to some degree by the prior art apparatus and approaches which are contained in the following U.S. patents:

U.S. Pat. No. 3,833,410 issued to Ang et al on 3 Sept. 1974;

U.S. Pat. No. 4,498,071 issued to Plough, Jr. et al on 5 Feb. 1985;

U.S. Pat. No. 4,520,342 issued to Vugts on 28 May 1985;

U.S. Pat. No. 4,560,583 issued to Moksvold on 24 Dec. 1985; and

U.S Pat. No. 4,597,163 issued to Tsang on 1 July 1986.

Ang et al patent describes thin-film resistors which are made of thin-film materials that include tantalum. The substrate materials recited in this patent are silicon, ceramic, quartz and glass.

Plough, Jr. et al patent is concerned with a high resistance thin-film resistor with military specifcation stability. It is formed by depositing a thin metal film on a substrate such as glass.

Vugts patent discusses a thin-film resistor that is formed on chromium silicon of an insulating substrate. The resistance range of this material is 100 kilo-ohms to 10 meg-ohms per square.

Moksvold patent discloses a method of forming an integrated resistor element by ion implantation. The implantation results in a resistor bar on a semiconductor wafer.

Tsang patent improves film adhesion between metallic silicide and polysilicon in thin-film integrated circuit structures by ion implantation. The patented method includes the steps of depositing a metallic silicide on a substrate and then implanting selected ions at predetermined doses and energies into the silicide layer whereby tensile stress generated during fabrication processes is reduced.

SUMMARY OF THE INVENTION

This invention pertains to a thin-film resistor structure and the method of making same for radiation-hardened integrated circuits. The resistor is formed using a thin-film metallic conductor layer such as tantalum or chromium silicide which is deposited by ion implantat-i,on on the surface of fused phosphosilicate glass (PSG) or borophosphosilicate glass (BPSG) substrate. Implantation is at an energy level which provides sufficient penetration to insure good adhesion and the resistor is annealed at temperatures up to 700° C. The resistor is formed and annealed prior to deposition of metal, e.g. aluminum, on the substrate. Advantages of ion implantation include very accurate control of dosage, and good adhesion of deposited films.

It is one object of the present invention, therefore, to provide an improved thin-film resistor on a silicon substrate.

It is another object of the invention to provide an improved thin-film resistor wherein a thin-film metallic conductive layer is deposited by ion implantation.

It is still another object of the invention to provide an improved thin-film resistor wherein ion implantation of a silicon substrate is achieved at an energy level of 20–180 kilovolts.

It is an even further object of the invention to provide an improved thin-film resistor wherein ion implantation achieves sufficient penetration of and good adhesion to the substrate material.

It is yet another object of the invention to provide an improved thin-film resistor wherein the resistor is annealed after implantation at temperatures between 400° to 700° C.

It is still a further object of the invention to provide an improved thin-film resistor wherein very accurate control of resistor material depth and geometry is achieved by ion implantation.

These and other advantages, objects and features of the invention will become more apparent after considering the following description taken in conjunction with the illustrative embodiment in the accompanying drawing.

BRIEF DESCRIPTION OF THE DRAWING

The sole FIGURE is a top view of a pair of thin-film resistors which were formed by ion implantation on a silicon substrate.

DESCRIPTION OF THE PREFERRED EMBODIMENT

Silicon integrated circuits frequently use doped polysilicon as a load resistor. Typically, the polysilicon layer is obtained by low-pressure chemical vapor deposition, and the doping is obtained by ion implantation of phosphorus or arsenic.

For radiation-hardened integrated circuit applications, a resistor layer with a sheet resistivity on the order of $10^5$ ohms per square is desired. Ideally the resistor should have a low temperature coefficient of resistance, and should not significantly change in resistivity as a result of total dose radiation such as $10^6$ rads (Si). Both of these requirements are very difficult to achieve in conventional lightly-doped polysilicon resistors.

Referring now to the sole FIGURE, there is shown the typical resistor geometry for a pair of thin-film resistors 10*a*, 10*b*. The thin-film resistors 10*a*, 10*b* are formed on and in the substrate 12 which may comprise any of the available silicon-based substrates. For the present example, the resistor layer for a radiation-hardened integrated circuit may be formed using a thin-film metallic conductor layer which is deposited by ion implantation on the surface of a substrate, such as fused phosphosilicate glass (PSG) or borophosphosilicate glass (BPSG). The ion implantation of the resistor geometry occurs prior to the steps of the aluminum (Al) metal (or alloy) deposition, patterning, alloying, passivation layer deposition, and the bond pad opening. The thin-film resistor layer would thus be subjected to a temperature on the order of 450° C. which is utilized for the aluminum (Al) alloying step. The sintered aluminum (Al) contacts to the resistor layer would be formed during this step also.

The resistor layer would be implanted at an energy level which provides sufficient penetration to insure good adhesion. This energy level is on the order of 20–180 kilovolts. The annealing process of the resistor may be performed at temperatures up to 700° C. without adverse effect. The resistor geometry may be patterned on the substrate either by etching to remove undesired areas, or by implantation over a patterned resist layer, which is followed by the removal of the photo-resist prior to the annealing process or step.

The following are a few examples of the possible metallic conductor materials which may be utilized to form the thin-film resistive layer: tantalum, ruthenium, rhodium, platinum and chromium silicide. However, in the case of tantalum or of chromium silicide resistors, it would be necessary to avoid the process steps, subsequent to the resistor deposition step, which would result in excessive oxidation of the resistor material. The advantages of the use of ion implantation for the formation of thin-film resistors on silicon substrates include very accurate control of dosage, and the good adhesion of the deposited films.

Since the thin-film resistor formation process puts the resistor geometries very close to the substrate surface, the pattern which may be used for the contact cut does not provide contacts to the ends of the resistors, but only to underlying single-crystal silicon and polysilicon. After the contact cuts are made, the photo-resist is stripped. A brief etch of the entire wafer surface can be used, immediately prior to metal deposition, to remove oxide which may have formed over the surface of the implanted thin-film resistor or the silicon surfaces in the contact cuts. In wet etch processes, a dip in 50:1 $H_2O$: concentrated hydrofluoric acid for 2 seconds could be used.

The required ion implant dosage depends upon the electrical conductivity of the thin-film resistor after sintering. If it is assumed that the resistor will have, for example, a conductivity of 1 percent of that of the pure bulk metal (or compound), then the dosage which is required to achieve a sheet resistance of 100,000 ohms per square, can be estimated from the data on electrical resistivity and the density of bulk metals. On that basis, a dosage of approximately $6\times10^{14}$ Ru ions per square centimeter would be used for ruthenium resistors.

Although the invention has been described with reference to a particular embodiment, it will be understood to those skilled in the art that the invention is capable of a variety of alternative embodiments within the spirit and scope of the appended claims.

What is claimed is:

1. The method of forming thin-film resistors on silicon substrates comprising the steps of:

providing an oxide-covered silicon substrate;

implanting metallic conductor ions at a predetermined energy level into said oxide-covered silicon to form a conductive layer;

depositing a photo-resist layer upon said conductive layer;

placing a patterned mask upon said photo-resistor layer;

exposing said photo-resistor layer;

removing the unexposed photo-resist layer;

etching to remove undesired areas of said conductive layer;

dissolving remaining photo-resist;

applying heat in the temperature range of 450° C. to 700° C. to anneal said conductive layer; and, forming bonding pad on said conductive layers to form resistive elements.

2. The method of forming thin-film resistors on silicon substrates comprising the steps of:

providing an oxide-covered silcone substrate;

depositing a photo-resist layer upon said oxide-cover silicon substrate;

applying a mask and forming a pattern on said photo-resist layer;

implanting metallic conductor ions at a predetermined energy level into said oxide-covered silicon substrate to form a conductive layer;

dissolving remaining photo-resist layer;

depositing an alloy layer on said oxide-covered silicon substrate and said conductive layer;

patterning said alloy layer;

applying heat in the temperature range of 450° C. to 700° C. to anneal said conductive layer; and, forming bonding pad on said conductive layers to form resistive elements.

3. The method of forming thin-film resistors of claim 1 wherein said energy level is in the range of 20 to 180 kilovolts.

4. The method of forming thin-film resistors of claim 1 wherein said conductive layer is one of a group comprising: tantalum, ruthenium, rhodium, platinum and chromium silicide.

5. The method of forming thin-film resistors of claim 2 wherein said energy level is in the range of 20 to 180 kilovolts.

6. The method of forming thin-film resistors of claim 2 wherein said conductive layer is one of a group comprising: tantalum, ruthenium, rhodium, platinum and chromium silicide.

* * * * *